(12) United States Patent
Lee et al.

(10) Patent No.: US 6,867,071 B1
(45) Date of Patent: Mar. 15, 2005

(54) LEADFRAME INCLUDING CORNER LEADS AND SEMICONDUCTOR PACKAGE USING SAME

(75) Inventors: Choon Heung Lee, Kyunggi-do (KR); Sung Sik Jang, Kyunggi-do (KR); Su Yol Yoo, Seoul (KR)

(73) Assignee: Amkor Technology, Inc., Chandler, AZ (US)

( * ) Notice: Subject to any disclaimer, the term of this patent is extended or adjusted under 35 U.S.C. 154(b) by 292 days.

(21) Appl. No.: 10/194,557

(22) Filed: Jul. 12, 2002

(51) Int. Cl.⁷ .............................................. H01L 21/44
(52) U.S. Cl. ..................................................... 438/123
(58) Field of Search ............................... 438/123, 106, 438/118, 112, 110; 257/796, 531, 790, 720, 712, 707; 29/827

(56) References Cited

U.S. PATENT DOCUMENTS

| | | |
|---|---|---|
| 3,838,984 A | 10/1974 | Crane et al. |
| 4,054,238 A | 10/1977 | Lloyd et al. |
| 4,530,152 A | 7/1985 | Roche et al. |
| 4,707,724 A | 11/1987 | Suzuki et al. |
| 4,756,080 A | 7/1988 | Thorp, Jr. et al. |
| 4,812,896 A | 3/1989 | Rothgery et al. |
| 4,907,067 A | 3/1990 | Derryberry |
| 5,029,386 A | 7/1991 | Chao et al. |
| 5,041,902 A | 8/1991 | McShane |
| 5,087,961 A | 2/1992 | Long et al. |
| 5,157,480 A | 10/1992 | McShane et al. |
| 5,172,213 A | 12/1992 | Zimmerman |
| 5,172,214 A | 12/1992 | Casto |
| 5,197,183 A * | 3/1993 | Chia et al. ..................... 29/827 |
| 5,200,362 A | 4/1993 | Lin et al. |
| 5,200,809 A | 4/1993 | Kwon |
| 5,214,845 A | 6/1993 | King et al. |
| 5,216,278 A | 6/1993 | Lin et al. |
| 5,221,642 A | 6/1993 | Burns |
| 5,258,094 A | 11/1993 | Furui et al. |
| 5,273,938 A | 12/1993 | Lin et al. |
| 5,277,972 A | 1/1994 | Sakumoto et al. |
| 5,278,446 A | 1/1994 | Nagaraj et al. |

(List continued on next page.)

FOREIGN PATENT DOCUMENTS

| | | |
|---|---|---|
| DE | 19734794 A1 | 8/1997 |
| EP | 0794572 A2 | 10/1997 |
| JP | 5745959 | 3/1982 |

(List continued on next page.)

*Primary Examiner*—Carl Whitehead, Jr.
*Assistant Examiner*—Monica D. Harrison
(74) *Attorney, Agent, or Firm*—Stetina Brunda Garred & Brucker

(57) ABSTRACT

A leadframe comprising a frame body having four peripheral sides, each adjacent pair of which collectively defines a frame corner. Disposed within a central space or opening defined by the frame body is a die paddle including four peripheral edge segments, each adjacent pair of which collectively define a paddle corner. The leadframe also includes a plurality of tie bars, each of which comprises a first portion extending from a respective paddle corner of the die paddle and a second portion which extends angularly from the first portion and perpendicularly into connection with one of the sides of the frame body. Connected to and extending from the sides of the frame body toward and in spaced relation to respective ones of the peripheral edge segments of the die paddle are a plurality of leads. Additionally, connected to and extending from the sides of the frame body in close proximity to respective ones of the frame corners are a plurality of corner leads. Each of the corner leads extends in spaced, generally parallel relation to at least one of the peripheral edge segments of the die paddle.

25 Claims, 15 Drawing Sheets

U.S. PATENT DOCUMENTS

| | | | |
|---|---|---|---|
| 5,279,029 A | 1/1994 | Burns | |
| 5,294,897 A | 3/1994 | Notani et al. | |
| 5,332,864 A | 7/1994 | Liang et al. | |
| 5,336,931 A | 8/1994 | Juskey et al. | |
| 5,343,076 A | 8/1994 | Katayama et al. | |
| 5,406,124 A | 4/1995 | Morita et al. | |
| 5,410,180 A | 4/1995 | Fujii et al. | |
| 5,424,576 A | 6/1995 | Djennas et al. | |
| 5,428,248 A | 6/1995 | Cha | |
| 5,435,057 A | 7/1995 | Bindra et al. | |
| 5,474,958 A | 12/1995 | Djennas et al. | |
| 5,521,429 A | 5/1996 | Aono et al. | |
| 5,581,122 A | 12/1996 | Chao et al. | |
| 5,604,376 A | 2/1997 | Hamburgen et al. | |
| 5,608,267 A | 3/1997 | Mahulikar et al. | |
| 5,625,222 A | 4/1997 | Yoneda et al. | |
| 5,639,990 A | 6/1997 | Nishihara et al. | |
| 5,640,047 A | 6/1997 | Nakashima | |
| 5,641,997 A | 6/1997 | Ohta et al. | |
| 5,646,831 A | 7/1997 | Manteghi | |
| 5,650,663 A | 7/1997 | Parthasaranthi | |
| 5,683,806 A | 11/1997 | Sakumoto et al. | |
| 5,696,666 A | 12/1997 | Miles et al. | |
| 5,701,034 A | 12/1997 | Marrs | |
| 5,710,064 A | 1/1998 | Song et al. | |
| 5,736,432 A | 4/1998 | Mackessy | |
| 5,776,798 A | 7/1998 | Quan et al. | |
| 5,783,861 A | 7/1998 | Son | |
| 5,835,988 A | 11/1998 | Ishii | |
| 5,844,306 A | 12/1998 | Fujita et al. | |
| 5,859,471 A | 1/1999 | Kuraishi et al. | |
| 5,866,939 A | 2/1999 | Shin et al. | |
| 5,877,043 A | 3/1999 | Alcoe et al. | |
| 5,886,398 A | 3/1999 | Low et al. | |
| 5,894,108 A | 4/1999 | Mostafazadeh et al. | |
| 5,942,794 A | 8/1999 | Okumura et al. | |
| 5,959,356 A | 9/1999 | Oh | |
| 5,973,388 A | 10/1999 | Chew et al. | |
| 5,977,613 A | 11/1999 | Takata et al. | |
| 5,977,615 A | 11/1999 | Yamaguchi et al. | |
| 5,977,630 A | 11/1999 | Woodworth et al. | |
| 5,981,314 A | 11/1999 | Glenn et al. | |
| 5,986,885 A | 11/1999 | Wyland | |
| 6,001,671 A | 12/1999 | Fjelstad | |
| 6,025,640 A | 2/2000 | Yagi et al. | |
| 6,034,423 A | 3/2000 | Mostafazadeh et al. | |
| 6,072,228 A | 6/2000 | Hinkle et al. | |
| 6,130,115 A | 10/2000 | Okumura et al. | |
| 6,130,473 A | 10/2000 | Mostafazadeh et al. | |
| 6,140,154 A | 10/2000 | Hinkle et al. | |
| 6,143,981 A | 11/2000 | Glenn | |
| 6,184,465 B1 | 2/2001 | Corisis | |
| 6,198,171 B1 | 3/2001 | Huang et al. | |
| 6,225,146 B1 | 5/2001 | Yamaguchi et al. | |
| 6,229,200 B1 | 5/2001 | Mclellan et al. | |
| 6,242,281 B1 | 6/2001 | Mclellan et al. | |
| 6,281,566 B1 | 8/2001 | Magni | |
| 6,281,568 B1 | 8/2001 | Glenn et al. | |
| 6,294,100 B1 | 9/2001 | Fan et al. | |
| 6,384,472 B1 | 5/2002 | Huang | |

FOREIGN PATENT DOCUMENTS

| | | |
|---|---|---|
| JP | 59208756 | 11/1984 |
| JP | 59227143 | 12/1984 |
| JP | 60195957 | 10/1985 |
| JP | 60231349 | 11/1985 |
| JP | 629639 | 1/1987 |
| JP | 6138555 | 2/1988 |
| JP | 63205935 | 8/1988 |
| JP | 63233555 | 9/1988 |
| JP | 1106456 | 4/1989 |
| JP | 6092076 | 4/1994 |
| JP | 7312405 | 11/1995 |
| JP | 8125066 | 5/1996 |
| JP | 8306853 | 11/1996 |
| JP | 96207 | 1/1997 |
| JP | 98205 | 1/1997 |
| JP | 98206 | 1/1997 |
| JP | 992775 | 4/1997 |
| KR | 941979 | 1/1994 |
| KR | 9772356 | 11/1997 |

* cited by examiner

LEADFRAME INCLUDING CORNER LEADS AND SEMICONDUCTOR PACKAGE USING SAME

CROSS-REFERENCE TO RELATED APPLICATIONS (Not Applicable)

STATEMENT RE: FEDERALLY SPONSORED RESEARCH/DEVELOPMENT (Not Applicable)

BACKGROUND OF THE INVENTION

1. Field of the Invention

The present invention relates generally to semiconductor packages, and more particularly to a semiconductor package including a uniquely configured leadframe including corner leads which are particularly suited to provide signal routing capability at each of the four corner regions of the semiconductor package.

2. Description of the Related Art

As is well known in the electrical arts, leadframes for use in semiconductor packages are formed by a variety of methods, including mechanically stamping or chemically etching a continuous metal strip. Such metal strip is typically made of copper, iron, a copper alloy, or their equivalents. The leadframe serves multiple functions in the semiconductor package by providing a conductive path to a semiconductor die, an external circuit, and a frame for fixing the semiconductor package to an external device. A growing trend in the electronics industry has been to miniaturize semiconductor packages and hence the leadframes thereof, with currently developed semiconductor packages having a thickness much smaller than those known in the prior art. There has also been a growing trend to increase the number of leads in the leadframe to accommodate the steadily increasing numbers of bond pads or contacts of the semiconductor die of the semiconductor package.

Conventional leadframe designs typically comprise an outer frame having a die paddle disposed within the interior thereof. The die paddle is fixed to the outer frame by a plurality of diagonally extending tie bars which typically extend from respective ones of four corner regions defined by the die paddle. The deficiency of this configuration is that leads which would otherwise be used for signaling cannot be formed in diagonal directions (i.e., at the corners of the die paddle) in the semiconductor package. Though the tie bars may be used for ground or power transmission, they typically cannot be used for signaling purposes, thus providing limitations or constraints in the footprint design of the semiconductor package. The designs of certain semiconductor devices or external devices mandate that leads adapted to transmit input and/or output signals be formed at each of the four corner regions of the semiconductor package. However, as indicated above, in conventional leadframe designs, such signal routing capability is not provided at the four corners of the semiconductor package due to the arrangement of the tie bars thereof. This particular deficiency of conventional leadframe designs is alleviated by the present invention, as will be described in more detail below.

BRIEF SUMMARY OF THE INVENTION

A leadframe comprising a frame body having four peripheral sides, each adjacent pair of which collectively defines a frame corner. Disposed within a central space or opening defined by the frame body is a die paddle including four peripheral edge segments, each adjacent pair of which collectively define a paddle corner. The leadframe also includes a plurality of tie bars, each of which comprises a first portion extending from a respective paddle corner of the die paddle and a second portion which extends angularly from the first portion and perpendicularly into connection with one of the sides of the frame body. Connected to and extending from the sides of the frame body toward and in spaced relation to respective ones of the peripheral edge segments of the die paddle are a plurality of leads. Additionally, connected to and extending from the sides of the frame body in close proximity to respective ones of the frame corners are a plurality of corner leads. Each of the corner leads extends in spaced, generally parallel relation to at least one of the peripheral edge segments of the die paddle.

The corner leads overcome the limitations or constraints in the footprint designs of conventional semiconductor packages by allowing input and/or output signals to be transmitted at each of the four corner regions of a semiconductor package including the leadframe.

Further in accordance with the present invention, there is provided a semiconductor package including a leadframe having the above-described structural attributes, as well as a fabrication methodology for such semiconductor package.

The present invention is best understood by reference to the following detailed description when read in conjunction with the accompanying drawings.

BRIEF DESCRIPTION OF THE DRAWINGS

These, as well as other features of the present invention, will become more apparent upon reference to the accompanying drawings wherein.

Common reference numerals are used throughout the drawings and detailed description to indicate like elements.

DETAILED DESCRIPTION OF THE INVENTION

Figure 1A:
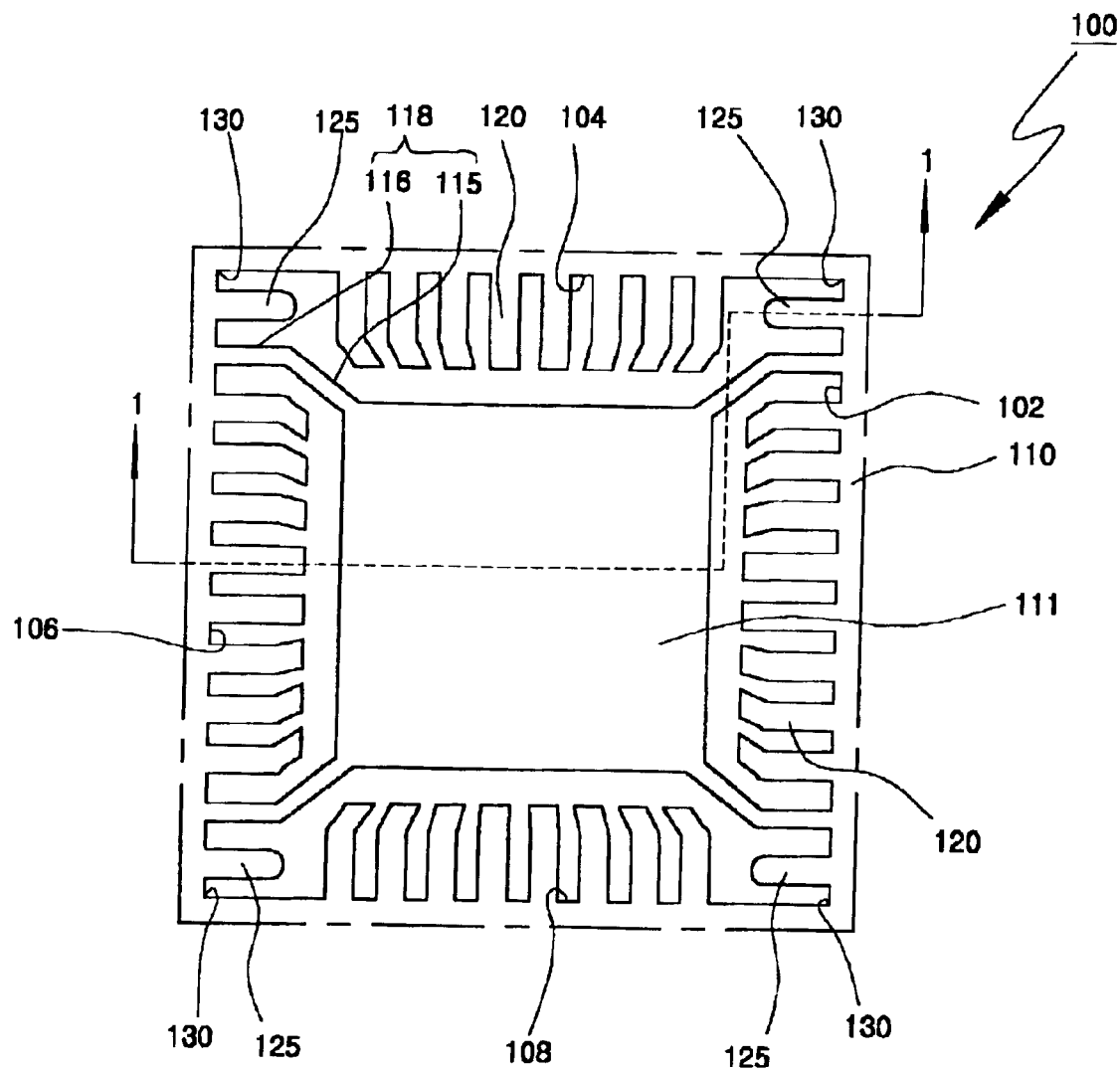
FIG. 1A is a top plan view of a leadframe constructed in accordance with a first embodiment of the present invention.

Referring now to the drawings wherein the showings are for purposes of illustrating preferred embodiments of the present invention only, and not for purposes of limiting the same, FIG. 1A provides a top plan view of a leadframe 100 constructed in accordance with a first embodiment of the present invention. The leadframe 100 is fabricated from a metal material, such as copper, copper alloy, plated copper, plated copper alloy, Alloy 37, or steel plated with copper, according to the application field. The leadframe 100 comprises an outer frame body 110 which is a quadrangle defining four sides 102, 104, 106, 108 separated from each other by four corner regions 130. The quadrangle shape of the leadframe 100 may be square (as shown) wherein the sides 102, 104, 106, 108 are of substantially equal length, or may alternatively be rectangular.

The frame body 110 defines a central opening or space which itself has a quadrangle shape. Located inside the frame body 110, and more particularly within the space defined thereby, is a die paddle 111 which, as will be shown and described in more detail below, is adapted to accommodate a semiconductor die. The die paddle 111 itself has a quadrangle shape corresponding to that of the frame body 110 such that the four sides 102, 104, 106, 108 of the frame body 110 extend along respective ones of the peripheral edge segments of the die paddle 111. As shown, the die paddle 111 has a square configuration wherein the peripheral edge segments or sides thereof are of substantially equal length. The die paddle 111 may alternatively have a rectangular configuration.

In the leadframe 100, the die paddle 111 is connected to the frame body 110 and supported within the space defined thereby by a plurality of tie bars 118. The tie bars 118 each include a first portion 115 which extends diagonally from a respective one of the four corners defined by the die paddle 111. In addition to the first portion 115, each tie bar 118 defines a second portion 116 which extends angularly from a respective first portion 115 and is connected to a respective one of the sides 102, 106 of the frame body 110 at approximately a right angle. Stated another way, two of the second portions 116 are connected to and extend perpendicularly from the side 102, with the remaining two second portions 116 being connected to and extending perpendicularly from the side 106.

Figure 1B:
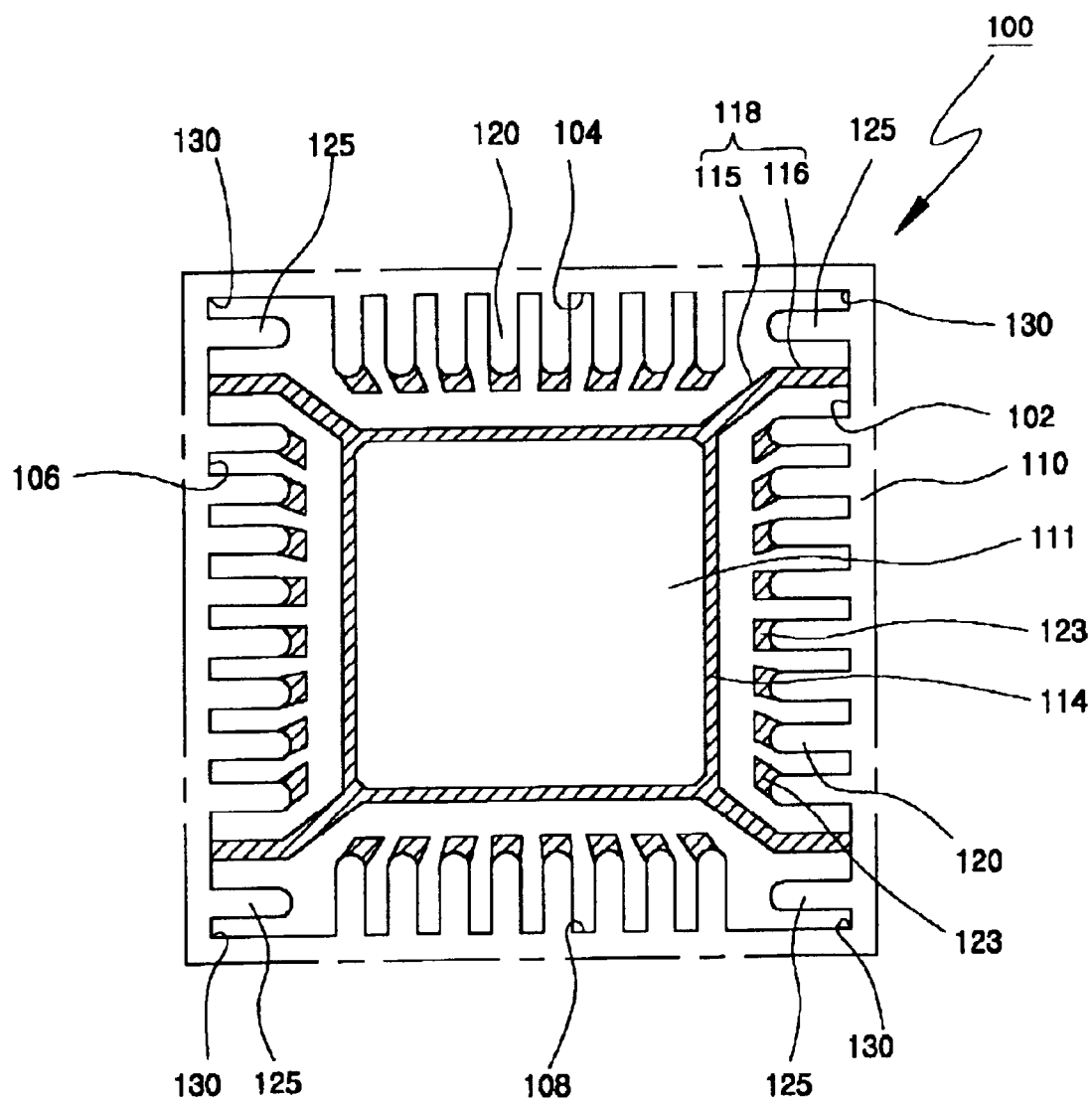
FIG. 1B is a bottom plan view of the leadframe shown in FIG. 1A.

The leadframe 100 of the first embodiment further comprises a plurality of leads 120 which are connected to respective ones of the sides 102, 104, 106, 108 and protrude inwardly into the space defined by the frame body 110 toward the peripheral edge segments or sides of the die paddle 111. As shown in FIGS. 1A and 1B, a total of thirty-two leads 120 are included in the leadframe 100, with the leads 120 being segregated into four sets of eight. Each set of eight leads 120 is connected to and extends from a respective one of the sides 102, 104, 106, 108 of the frame body 110, with the distal ends of the leads 120 each being disposed in spaced relation to a respective one of the four peripheral edge segments or sides of the die paddle 111. Each of the leads 120 includes a distal portion which is bent toward a respective one of the peripheral edge segments of the die paddle 111 at a prescribed angle. Those of ordinary skill in the art will recognize that the number, position and path of the leads 120 is exemplary only, and may be modified according to the application field.

In addition to the leads 120, the leadframe 100 includes a plurality of corner leads 125. More particularly, as shown in FIGS. 1A and 1B, four corner leads 125 are included in the leadframe 110. As will be described in more detail below, one end of each of the corner leads 125 is connected to the frame body 110, with the opposite, distal end thereof extending toward one of the leads 120 of the leadframe 100. More particularly, two of the corner leads 125 are connected to and extend perpendicularly from the side 102 of the frame body 110, with one corner lead 125 of the pair extending in the space defined between the side 104 and the second portion 116 of one of the tie bars 118, and the remaining corner lead 125 of the pair extending in the space defined between the side 108 and the second portion 116 of one of the tie bars 118. The remaining two corner leads 125 are connected to and extend perpendicularly from the side 106 of the frame body 110, with one corner lead 125 of the pair extending within the space defined between the side 104 and the second portion 116 of one of the tie bars 118, and the remaining corner lead 125 of the pair extending within the space defined between the side 108 and the second portion 116 of one of the tie bars 118. Thus, each of the corner leads 125 extends in spaced relation to a respective one of the corners 130. The free, distal ends of the corner leads 125 extend perpendicularly toward but are spaced from respective ones of the leads 120 connected to one of the sides 104, 108 of the frame body 110. Those corner leads 125 connected to the side 102 extend in generally parallel relation to those leads 120 connected to the side 102. Similarly, those corner leads 125 connected to the side 106 extend in generally parallel relation to those leads 120 connected to the side 106. In contrast to the leads 120 which are directed toward a respective one of the peripheral edge segments of the die paddle 111, none of the four corner leads 125 extend toward the die paddle 111. The corner leads 125 can be used for ground or power, but are preferably used for signaling purposes.

Figure 1C:
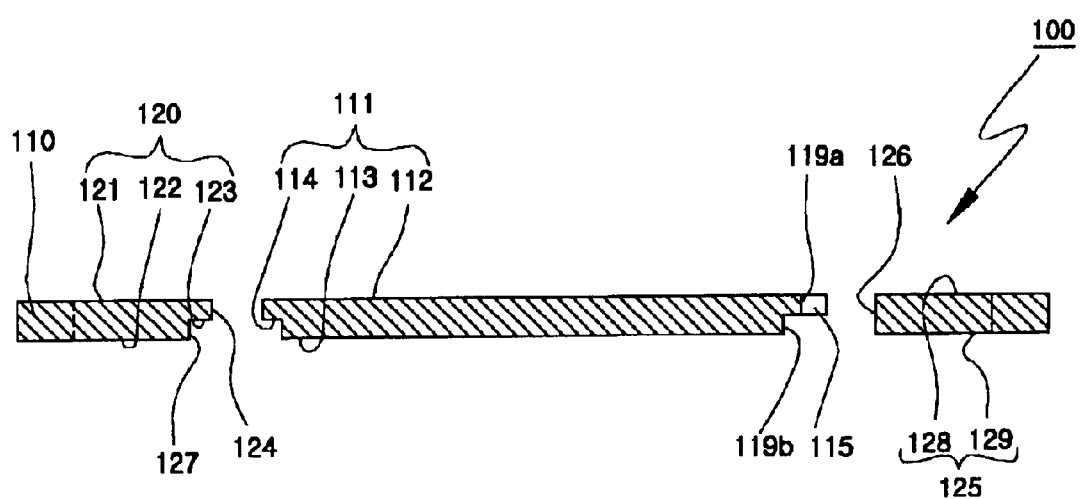
FIG. 1C is a cross-sectional view taken along line 1—1 of FIG. 1A.

As seen in FIGS. 1B and 1C, the leadframe 100 of the first embodiment is not of uniform thickness. The die paddle 111 includes a top, generally planar first surface 112 and a bottom, generally planar second surface 113 which is disposed in opposed relation to the first surface 112. The die paddle 111 also includes an etched surface 114 which is perpendicularly offset (vertically recessed) from the second surface 113 and extends along the four sides or peripheral edge segments of the die paddle 111. The etched surface 114 extends in generally parallel relation to the first and second surfaces 112, 113. The die paddle 111 further includes a vertical first side surface 119a which is formed and extends between the first surface 112 and the etched surface 114, and a vertical second side surface 119b which is formed and extends between the second surface 113 and the etched surface 114. As indicated above, the etched surface 114 is recessed or depressed vertically (perpendicularly) relative to the second surface 113 a prescribed distance, with the etched surface 114 extending about the periphery of the second surface 113. The first side surface 119a defines the outermost peripheral edge of the die paddle 111. In FIG. 1C, a segment of the first portion 115 of one of the tie bars 118 is illustrated. The etched surface 114 of the die paddle 111 is preferably formed through the implementation of a half-etching technique. The thickness of the die paddle 111 at the etched surface 114 is thinner than that of the remainder thereof, with the first portion 115 of each of the tie bars 118 preferably being connected to only the first side surface 119a of the die paddle 111.

As further seen in FIGS. 1B and 1C, each of the leads 120 defines a top, generally planar first surface 121 and a bottom, generally planar second surface 122 which is disposed in opposed relation to the first surface 121. Each of the leads 120 also includes an etched surface 123 which is formed in a distal portion of the lead 120 and is depressed or perpendicularly recessed relative to the second surface 122 by a prescribed distance. In this regard, each lead 120 further includes a vertical first side surface 124 which is formed and extends between the first surface 121 and the etched surface 123, and a vertical second side surface 127 which is formed and extends between the second surface 122 and the etched surface 123. The first and second surfaces 121, 122 of each lead 120 extend from the frame body 110 toward the die paddle 111, with the distal end of each lead 120 being defined by the first side surface 124 thereof. The length of the first surface 121 of each lead 120 exceeds that of the second surface 122 thereof due to the inclusion of the etched surface 123.

As seen in FIG. 1B, the etched surface 123 is included in the distal portion of each lead 120 which is bent or angled toward the die paddle 111. Additionally, the length of the second surface 122 of each lead 120 is approximately equal to the length of each of the corner leads 125. The etched surface 123 is preferably formed within each of the thirty-two leads 120 via the implementation of a half-etching technique. The thickness of each lead 120 at the etched surface 123 is thinner than that of the remainder thereof. The shaded portions of FIG. 1B illustrate the etched surface 114 of the die paddle 111 as well as the etched surfaces 123 of the leads 120.

As indicated above, the first portion 115 of each of the tie bars 118 is preferably connected to only the first side surface 119a of the die paddle 111. As further seen in FIG. 1B, the tie bars 118 are also half-etched such that the thickness thereof is approximately equal to the thickness of the die paddle 111 between the first surface 112 and etched surface 114 thereof (i.e., the height of the first side surface 119a). As will be discussed in more detail below, the inclusion of the etched surface 114 in the die paddle 111 and the etched surface 123 in each lead 120 enhances the mechanical interconnection between the die paddle 111, tie bars 118, and leads 120 to the encapsulant material forming the package body of a semiconductor package including the leadframe 100, thus preventing such components from being easily tilted or separated from the package body. Though the corner leads 125 are not etched to include etched surfaces, those of ordinary skill in the art will recognize that the corner leads 125, like the leads 120, can be half-etched to include etched surfaces to improve the bonding force thereof with the encapsulant material used to form the package body of the semiconductor package.

As further seen in FIG. 1C, each corner lead 125 includes a generally planar top first surface 128 and a generally planar bottom second surface 129 which is disposed in opposed relation to the first surface 128. The first and second surfaces 128, 129 extend from the frame body 110, with the lengths of the first and second surfaces 128, 129 being substantially equal. The lengths or areas of the first and second surfaces 128, 129, in addition to being equal to each other, are also approximately equal to the length or area of the second surface 122 of each lead 120. As will be discussed in more detail below, the second surface 122 of each lead 120 and the second surface 129 of each corner lead 125 will be exposed within the package body of the semiconductor package. Each corner lead 125 further includes a side surface 126 which is formed and extends between the first surface 128 and the second surface 129.

Figure 2:
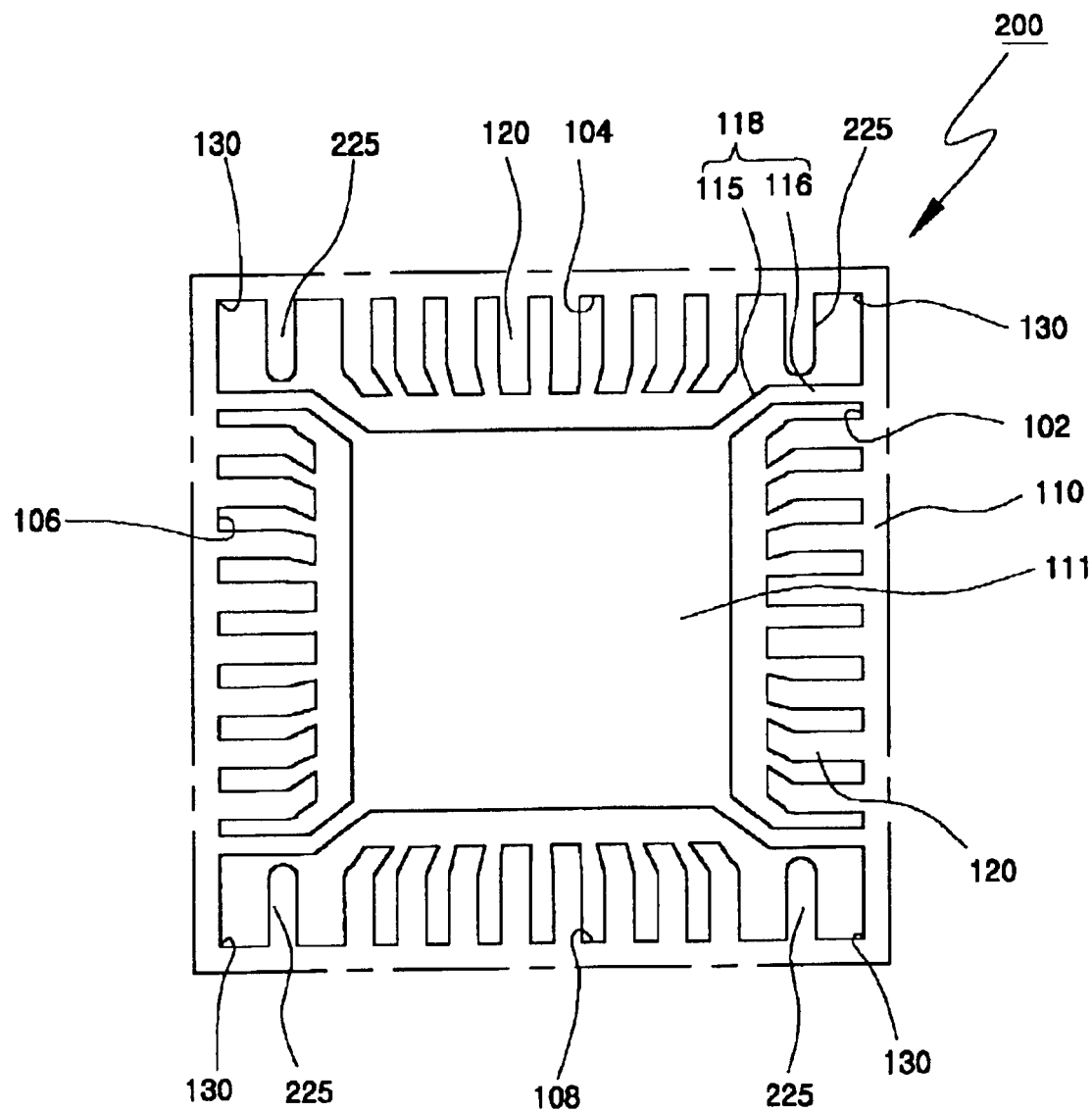
FIG. 2 is a top plan view of a leadframe constructed in accordance with a second embodiment of the present invention.

Referring now to FIG. 2, there is shown a leadframe 200 constructed in accordance with a second embodiment of the present invention. Since most of the structural attributes of the leadframe 200 are similar to those of the leadframe 100 described above, only the differences or distinctions between the same will be described below.

The leadframe 200 of the second embodiment also includes a total of four corner leads 225. As opposed to being connected to the sides 102, 106 as occurs in the leadframe 100, two of the corner leads 225 of the leadframe 200 are connected to and extend perpendicularly from the side 104 of the frame body 110, with one corner lead 225 of the pair extending in the space defined between the side 102 and one of the leads 120 connected to the side 104, and the remaining corner lead 225 of the pair extending in the space defined between the side 106 and one of the leads 120 connected to the side 104. The remaining two corner leads 225 of the leadframe 200 are connected to and extend perpendicularly from the side 108 of the frame body 110, with one corner lead 225 of the pair extending within the space defined between the side 102 and one of the leads 120 connected to the side 108, and the remaining corner lead 225 of the pair extending within the space defined between the side 106 and one of the leads 120 connected to the side 108. Thus, each of the corner leads 225 extends in spaced relation to a respective one of the corner regions 130. The free, distal ends of the corner leads 225 extend perpendicularly toward, but are spaced from, respective ones of the second portions 116 of the tie bars 118. Those corner leads 225 connected to the side 104 extend in generally parallel relation to those leads 120 connected to the side 104. Similarly, those corner leads 225 connected to the side 108 extend in generally parallel relation to those leads 120 connected to the side 108. The corner leads 225 can also be used for ground or power, but are preferably used for signaling purposes as well.

Figure 3:
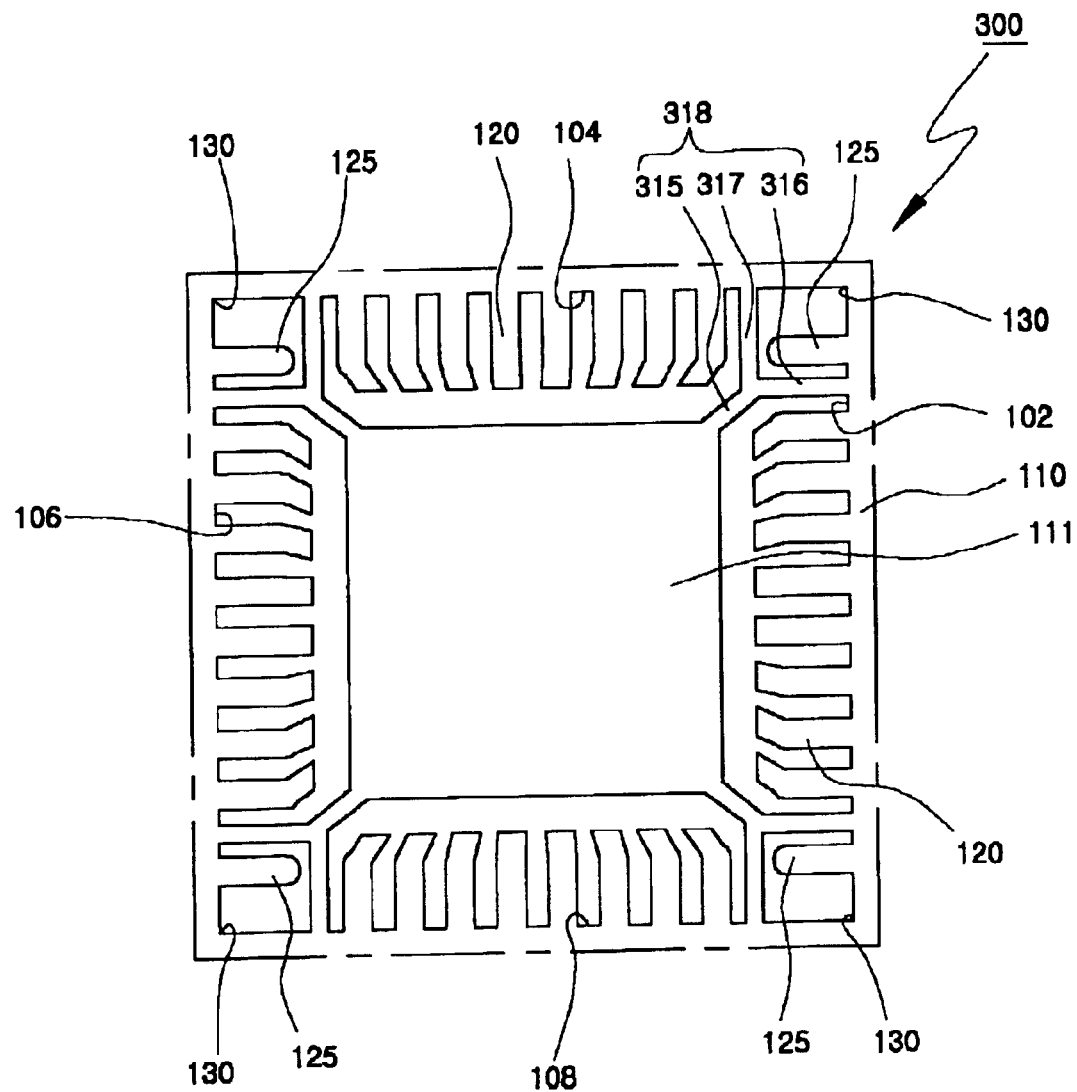
FIG. 3 is a top plan view of a leadframe constructed in accordance with a third embodiment of the present invention.

Referring now to FIG. 3, there is shown a leadframe 300 constructed in accordance with a third embodiment of the present invention. Since many of the structural attributes of the leadframe 300 are similar to those of the leadframe 100 of the first embodiment described above, only the structural distinctions will be discussed below.

The leadframe 300 of the third embodiment includes tie bars 318 which each include a first portion 315 which extends diagonally from a respective one of the four corners of the die paddle 111. In addition to the first portion 315, each tie bar 318 includes a second portion 316 which extends angularly from the first portion 315, and a third portion 317 which also extends angularly from the first portion 315. In this regard, each tie bar 318 has a generally Y-shaped configuration, with the second and third portions 316, 317 of each tie bar 318 extending in generally perpendicular relation to each other. The second and third portions 316, 317 of each tie bar 318 are connected to respective ones of a pair of sides 102, 104, 106, 108 which are separated by one of the corner regions 130. More particularly, the second portions 316 of two of the tie bars 318 each extend perpendicularly toward and are connected to the side 102, with the third portions 317 of such tie bars 318 extending perpendicularly toward and being connected to respective ones of the sides 104, 108. The second portions 316 of the remaining two tie bars 318 each extend perpendicularly toward and are connected to the side 106, with the third portions 317 of such tie bars 318 extending perpendicularly toward and being connected to respective ones of the sides 104, 108.

In the leadframe 300, the corner leads 125 extend in generally parallel relation to respective ones of the second portions 316 of the tie bars 318. As such, the corner leads 125 extend perpendicularly toward but are spaced from respective ones of the third portions 317 of the tie bars 318.

When the tie bars 318 are used for ground, the corner leads 125 are electrically separated from the leads 120 due to the extension of the second and third portions 316, 317 of the tie bars 318 therebetween, thereby decreasing a "cross-talk" phenomenon between the corner leads 125 and the leads 120. Those of ordinary skill in the art will recognize that the leadframe 300 may alternatively be configured to include the corner leads 225 connected to the sides 104, 108 as shown in FIG. 2.

Figure 4A:
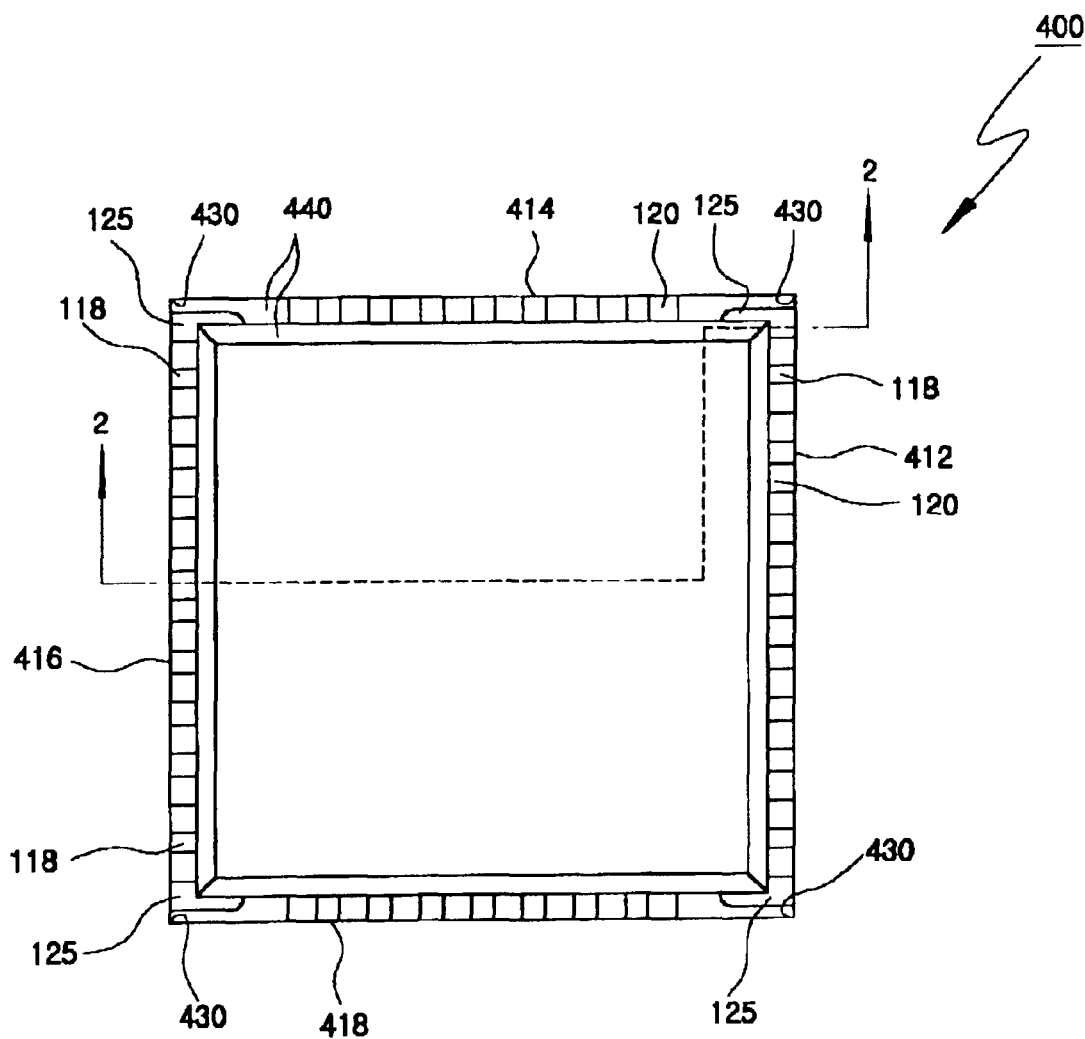
FIG. 4A is a top plan view of a semiconductor package including the leadframe of the first embodiment shown in FIGS. 1A–1C.
Figure 4B:
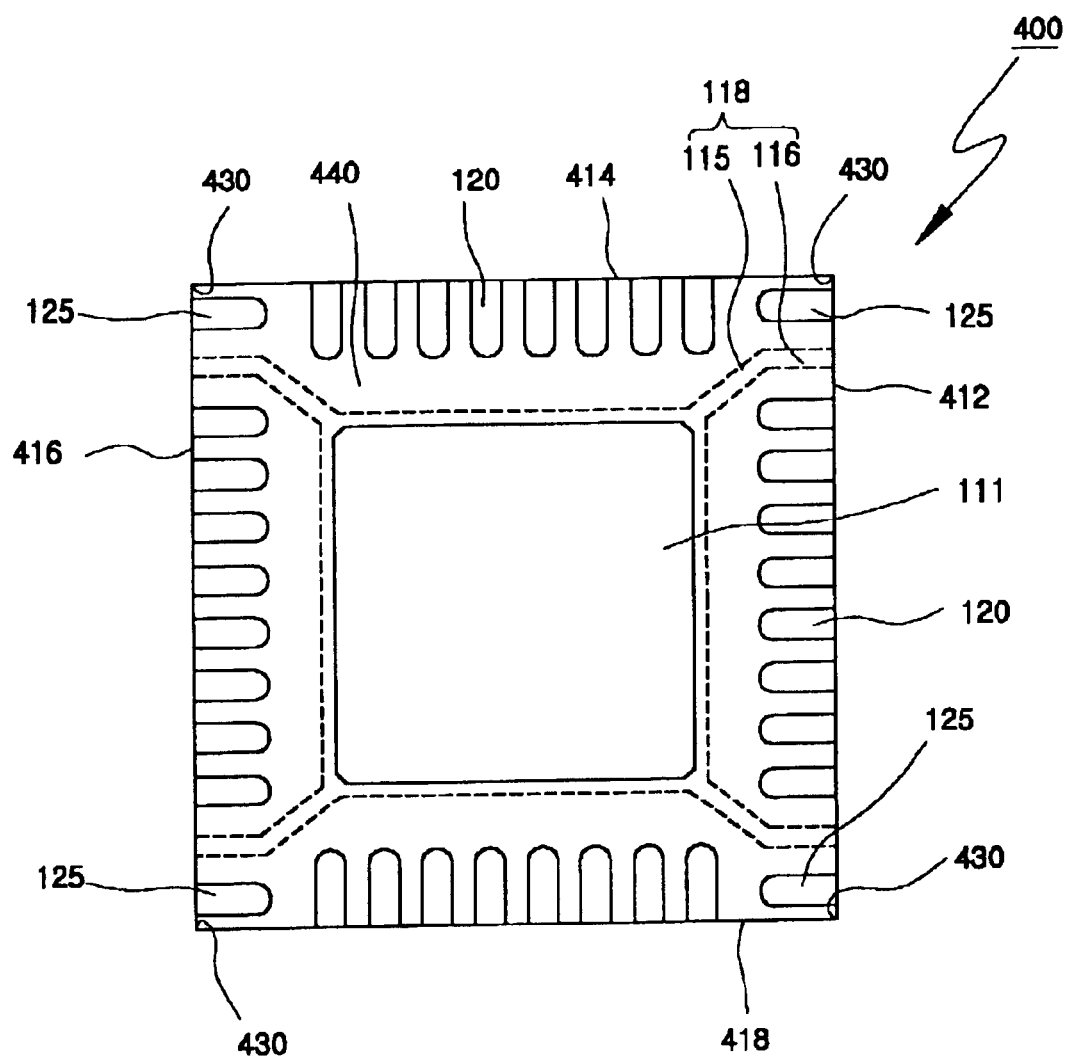
FIG. 4B is a bottom plan view of the semiconductor package shown in FIG. 4A.
Figure 4C:
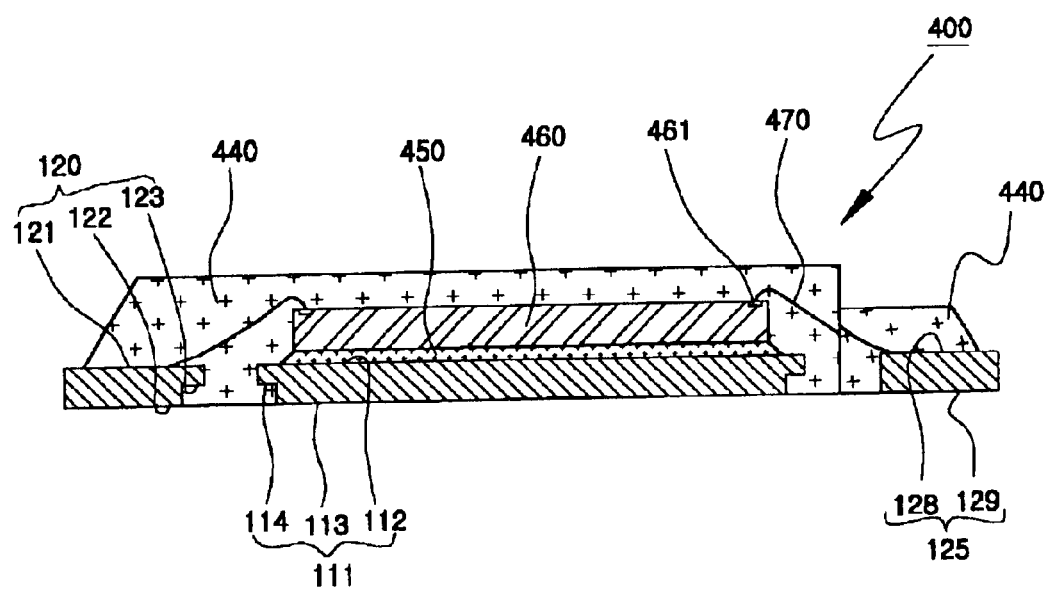
FIG. 4C is a cross-sectional view taken along line 2—2 of FIG. 4A.

Referring now to FIGS. 4A–4C, there is shown a semiconductor package 400 fabricated to include the leadframe 100 of the first embodiment as described above. In the semiconductor package 400, an encapsulant material applied to the leadframe 100 hardens to form a package body 440 which has a quadrangle shape defining four sides 412, 414, 416, 418. As shown, the package body 440 is generally square, with the sides 412, 414, 416, 418 being of substantially equal length. In addition to the sides 412, 414, 416, 418, the package body 440 defines four corners 430 which are disposed between respective, adjacent pairs of the sides 412, 414, 416, 418.

As best seen in FIG. 4A, in the semiconductor package 400, the package body 440 is formed such that portions of the first surfaces 121 of the leads 20 which extend to the sides 412, 414, 416, 418 are exposed within the top of the package body 440. Also exposed in the top of the package body 440 is a portion of the first surface 128 of each of the corner leads 125. The exposed portions of the first surfaces 128 of the corner leads 125 extend to the sides 412, 416 of the package body 440.

As seen in FIG. 4C, the second surfaces 122 of the leads 120, the second surfaces 129 of the corner leads 125, and the second surface 113 of the die paddle 111 are each exposed within the bottom of the package body 440. The leads 120 and corner leads 125 extend to and include ends which are exposed within respective ones of the sides 412, 414, 416, 418 of the package body 440 due to the singulation process used in the fabrication of the semiconductor package 400, as will be described in more detail below. Covered by the package body 440 are portions of the first surfaces 121 of the leads 120, portions of the first surfaces 128 of the corner leads 125, and a portion of the first surface 112 of the die paddle 111. Also covered by the package body 440 is the etched surface 114, first side surface 119a, and second side surface 119b of the die paddle 111, the etched surface 123, the first side surface 124 and second side surface 127 of each lead 120, and the side surface 126 of each corner lead 125. The side surfaces of each lead 120 extending between the first and second surfaces 121, 122 thereof are also covered by the package body 440. The mechanical interlock achieved by the flow of the encapsulant used to form the package body 440 along the etched surfaces 114, 123 assists in preventing any dislodging of the leads 120 or die paddle 111 from within the package body 440 as described above.

The package body 440 also covers each of the tie bars 118, except for a section of the second portion 116 of each tie bar 118 which extends to a respective one of the sides 412, 416 of the package body 440, and is exposed within such side 412, 416 and within the top of the package body 440 as is shown in FIGS. 4A and 4B. Due to the manner in which the package body 440 is formed as described above, that portion or area of the first surface 128 of each corner lead 125 which is exposed is greater than the exposed portion or area of the first surface 121 of each lead 120, as best seen in FIG. 4A. The thickness of each of the tie bars 118 is preferably in the range of about thirty percent to about seventy percent of that of each of the leads 120 (i.e., the thickness between the first surface 121 and second surface 122 of each lead 120).

The semiconductor package 400 further comprises a semiconductor die 460 which is attached to the approximate center of the first surface 112 of the die paddle 111. Such attachment is preferably facilitated through the use of a layer of die attach material 450. Included on the semiconductor die 460 are a plurality of bond pads 461. A plurality of conductive wires 470 are used to mechanically and electrically connect the bond pads 461 of the semiconductor die 460 to respective ones of the leads 120 and corner leads 125. The package body 440 covers or encapsulates the semiconductor die 460, the layer of die attach material 450, and the conductive wires 470. The leads 120, corner leads 125, and die paddle 125 are partially covered or encapsulated by the package body 440 in the above-described manner. The conductive wires 470 are each preferably fabricated from a material such as aluminum, copper, gold, silver, or their equivalents.

Figure 5:
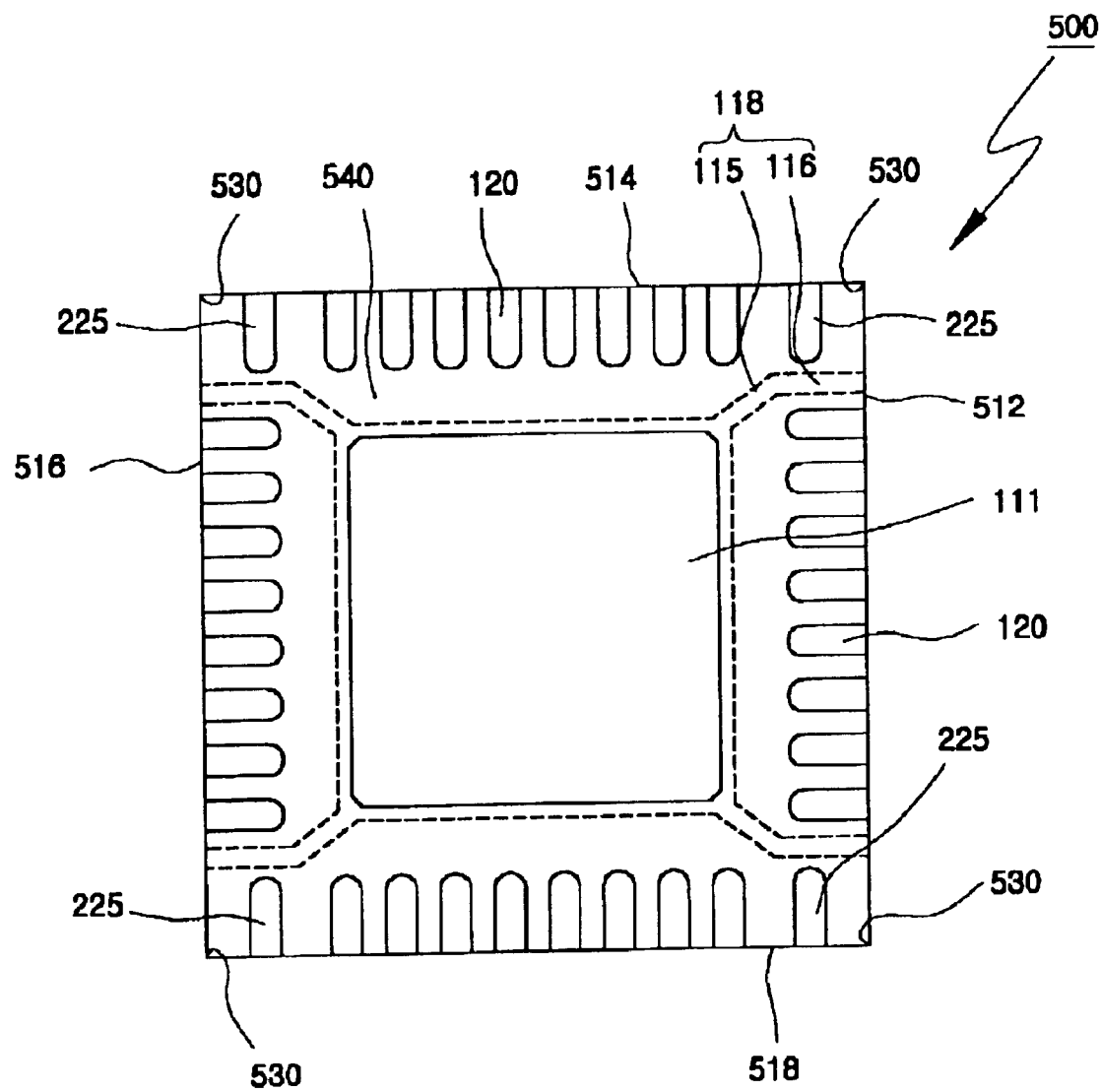
FIG. 5 is a bottom plan view of a semiconductor package including the leadframe of the second embodiment shown in FIG. 2.

Referring now to FIG. 5, there is shown a bottom plan view of a semiconductor package 500 fabricated to include the leadframe 200 of the second embodiment shown in FIG. 2. Similar to the semiconductor package 400, the semiconductor package 500 includes a package body 540 defining sides 512, 514, 516, 518, each adjacent pair of which is separated by a corner 530. Due to the structural attributes of the leadframe 200 as described above in relation to FIG. 2, two of the corner leads 225 extend to the side 514, with the two remaining corner leads 225 extending to the side 518. Other than for the alternative orientations of the corner leads 225 as compared to the orientations of the corner leads 125 of the semiconductor package 400 as shown in FIG. 4B, the structural attributes of the semiconductor package 500 are the same as those of the semiconductor package 400 as described above.

Figure 6:
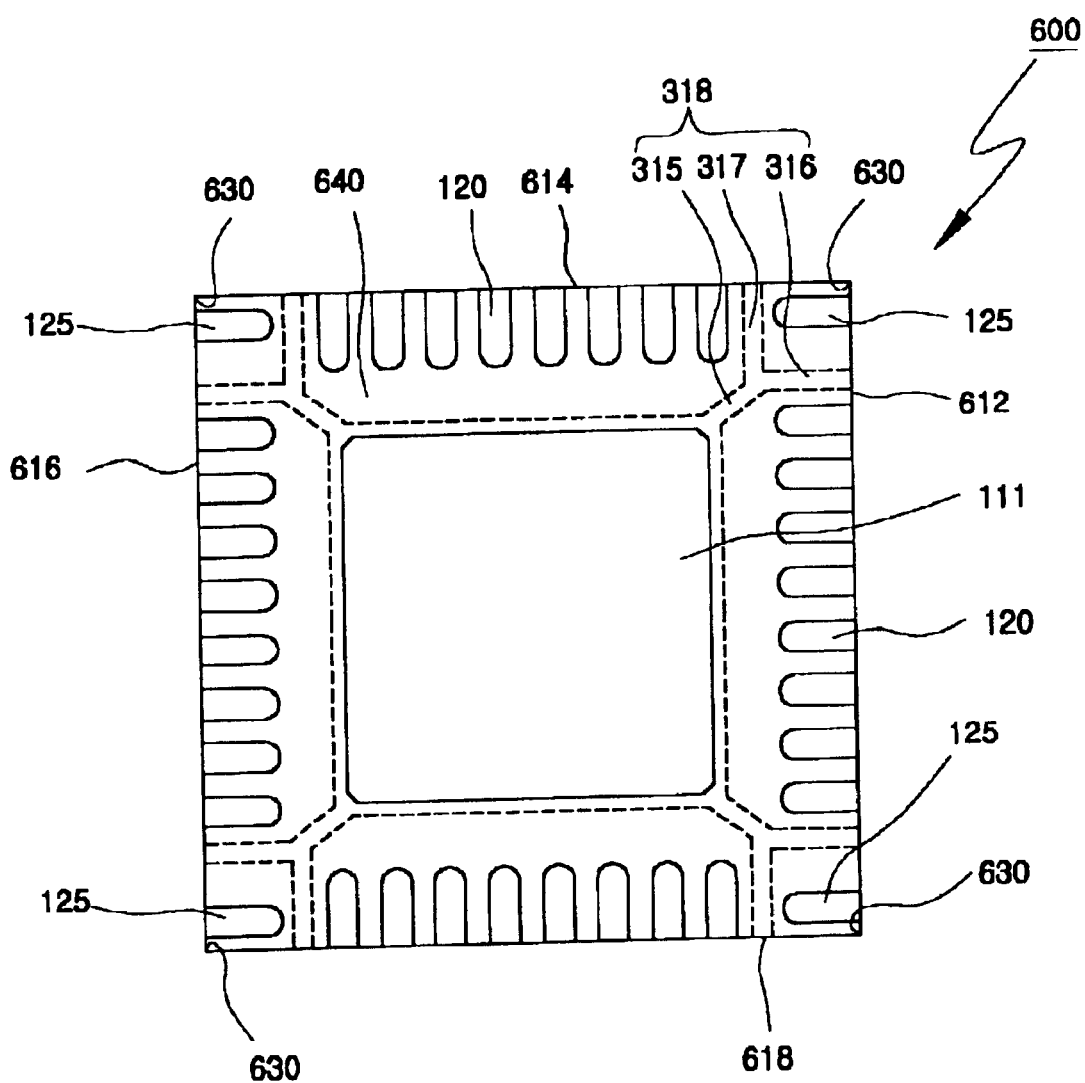
FIG. 6 is a bottom plan view of a semiconductor package including the leadframe of the third embodiment shown in FIG. 3.

Referring now to FIG. 6, there is shown a bottom plan view of a semiconductor package 600 fabricated to include the leadframe 300 of the third embodiment shown in FIG. 3. The semiconductor package 600 itself includes a package body 640 which defines sides 612, 614, 616, 618, adjacent pairs of which are separated by a corner 630. In the semiconductor package 600, the first portion 315 of each of the tie bars 318 is covered or encapsulated by the package body 640. The second portions 316 of two of the tie bars 318 extend to the side 612, with the second portions 316 of the remaining two tie bars 318 extending to the side 616. Similarly, the third portions 317 of two of the tie bars 318 extend to the side 614, with the third portions 317 of the remaining two tie bars 318 extending to the side 618. Though no portions or segments of the tie bars 318 are exposed within the bottom of the package body 640, small segments of the second and third portions 316, 317 which extend to the sides 612, 614, 616, 618 are exposed within the top of the package body 640 in a manner similar to that shown and described in relation to the tie bars 118 in FIG. 4A. The remaining structural attributes of the semiconductor package 600 are the same as those previously described in relation to the semiconductor package 400 shown in FIGS. 4A–4C.

Figure 7A:
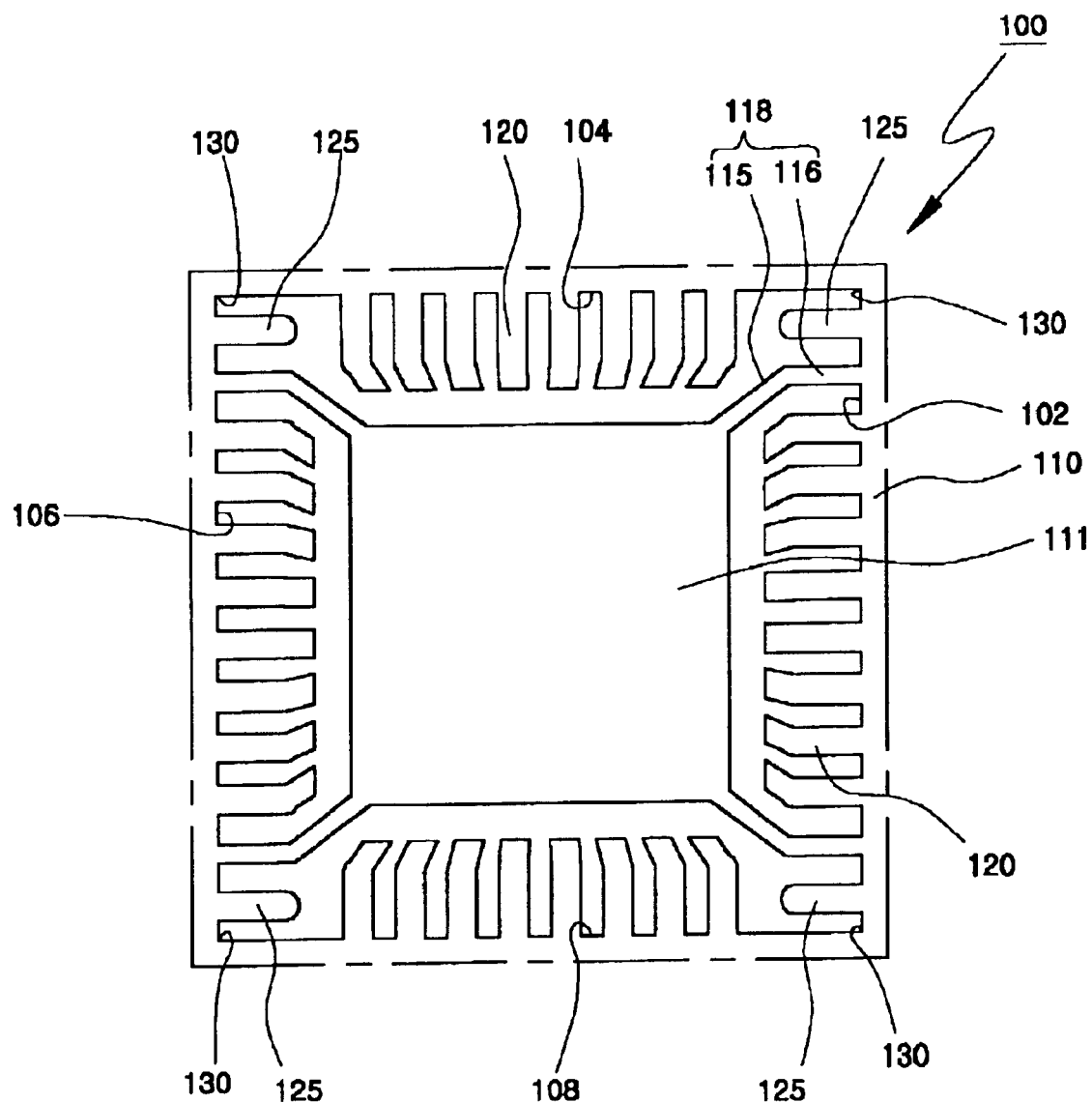
FIGS. 7A–7E are top plan views illustrating the sequence of steps used to fabricate the semiconductor package shown in FIGS. 4A–4C.
Figure 7B:
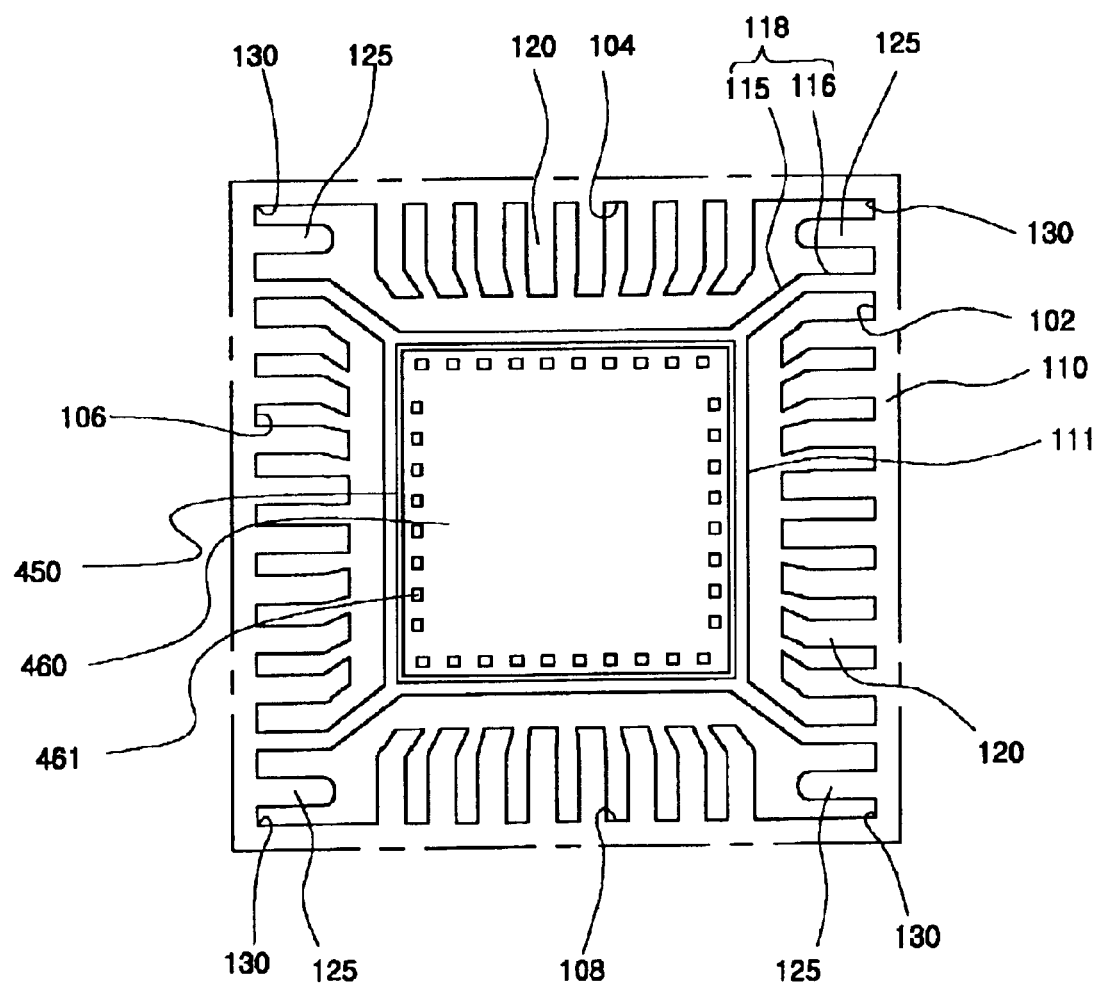
Figure 7C:
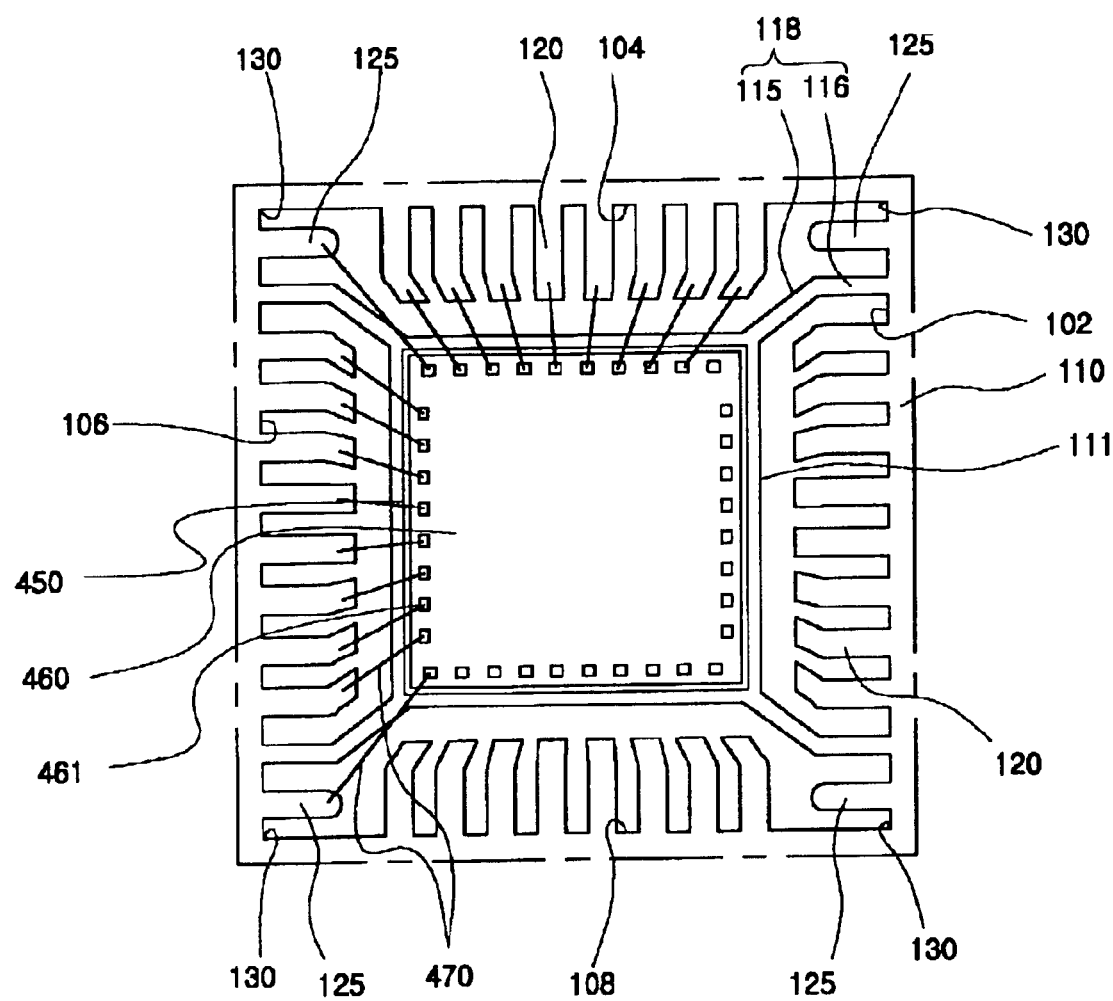

Referring now to FIGS. 7A–7E, there are shown the various steps of a method for fabricating the semiconductor package 400 shown in FIGS. 4A–4C. The initial step of the fabrication method comprises providing the leadframe 100 (FIG. 7A) which has the structural attributes described above in relation to FIGS. 1A–1C. As indicated above, the leadframe 100 may be formed through the implementation of a mechanical stamping process or a chemical etching process. Upon the fabrication of the leadframe 100, the semiconductor die 450 is attached to the first surface 112 of the die paddle 111 through the use of the layer of die attach material 450 (FIG. 7B). The die attach material 450 is hardened at a predetermined temperature after being applied to the die paddle 111 and the semiconductor die 460, thus effectuating the firm bonding or attachment of the semiconductor die 460 to the die paddle 111. Thereafter, each of the bond pads 461 exposed at the top surface of the semiconductor die 460 is mechanically and electrically connected to a respective one of the leads 120 and corner leads 125 via a conductive wire 470 (FIG. 7C). The conductive wires 470 preferably extend and are connected to the first surfaces 121 of respective ones of the leads 120, and the first surfaces 128 of respective ones of the corner leads 125.

Figure 7D:
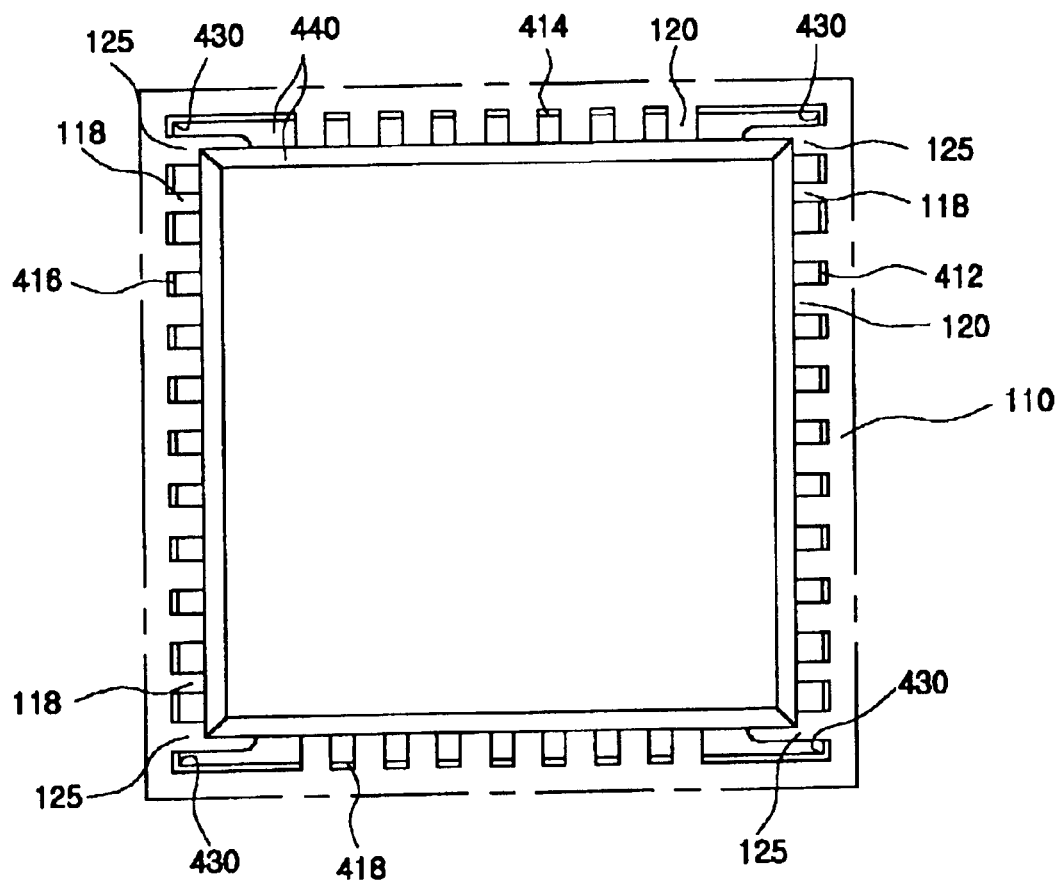

After the conductive wires 470 have been used to facilitate the mechanical and electrical connection of the semiconductor die 460 to the leadframe 100, the encapsulant material is applied to the leadframe 100 for purposes of forming the package body 440 (FIG. 7D). As explained above in relation to FIGS. 4A–4C, the encapsulating step is carried out such that the second surface 113 of the die paddle 111, the second surfaces 122 of the leads 120, the second surfaces 129 of the corner leads 125, portions of the first surfaces 121 of the leads 120, portions of the first surfaces 128 of the corner leads 125, and portions of the second portions 116 of the tie bars 118 are exposed within the package body 440. The encapsulation step is carried out between top and bottom molds of a predetermined shape (not shown), with the encapsulant material being injected between the top and bottom molds and exposed to high temperature and pressure to facilitate the hardening thereof. The leads 120 and corner leads 125 are each exposed within the top and bottom of the package body 440, with the tie bars 118 only being exposed within the top thereof and the die paddle 111 being exposed within only the bottom thereof.

Figure 7E:
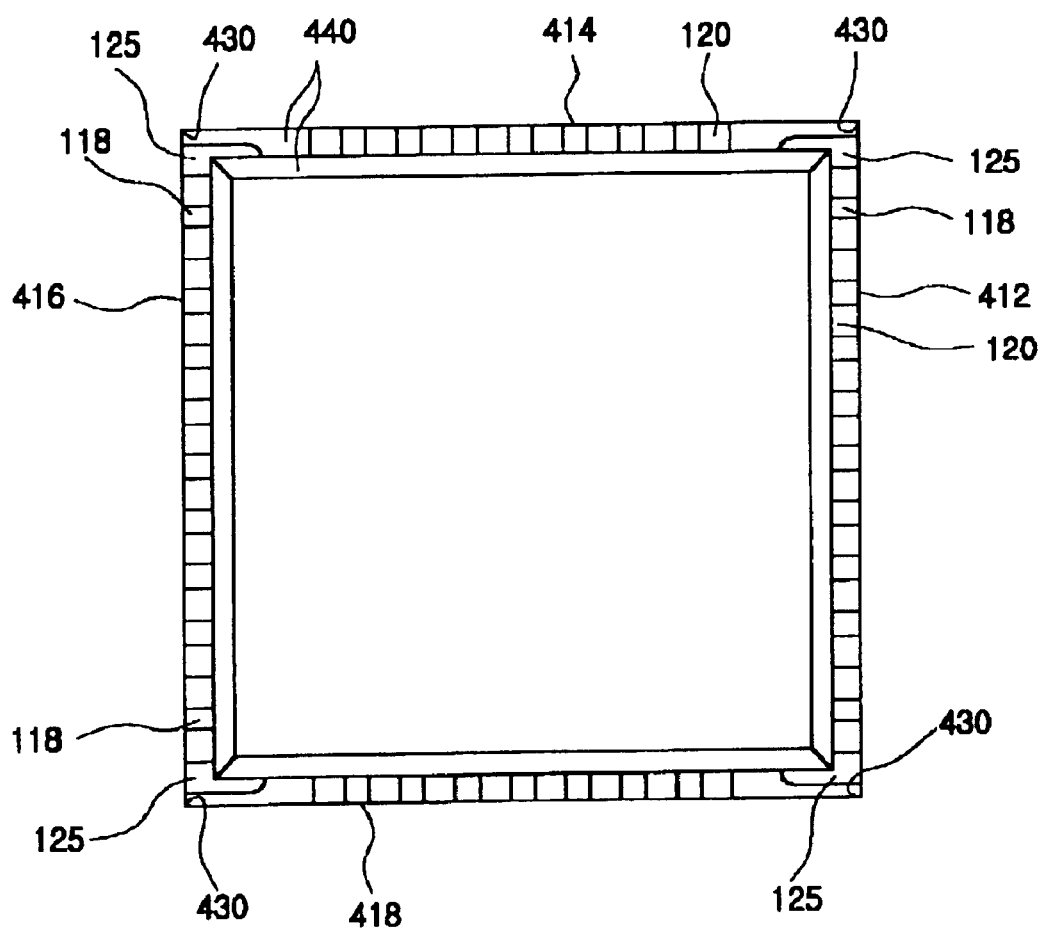

Subsequent to the formation of the package body 440, a singulating process is completed to remove excess portions of the leadframe 100 from the remainder thereof (FIG. 7E). In the singulating process, the leads 120, corner leads 125, and tie bars 18 are separated from the frame body 110 of the leadframe 100. The cutting of the leads 120, corner leads 125 and tie bars 118 from the frame body 110 completes the formation of the semiconductor package 400. As indicated above in relation to FIGS. 4A–4C, completion of the singulating process results in the cut ends of the leads 120, corner leads 125, and tie bars 118 being exposed within corresponding ones of the sides 412, 414, 416, 418 of the package body 440.

Though not shown, those of ordinary skill in the art will recognize that the fabrication methodology for the semiconductor packages 500, 600 described above is similar to that shown and described above in relation to the semiconductor package 400.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A leadframe comprising:
    a frame body including four peripheral sides, each adjacent pair of the sides collectively defining a frame corner, the frame body defining a central space;
    a die paddle disposed within the space and including four peripheral edge segments, each adjacent pair of peripheral edge segments collectively defining a paddle corner;
    a plurality of tie bars, each of the tie bars comprising a first portion extending from a respective paddle corner of the die paddle and a second portion which extends angularly from the first portion and perpendicularly into connection with one of the sides of the frame body;
    a plurality of leads connected to and extending from the sides of the frame body toward and in spaced relation to respective ones of the peripheral edge segments of the die paddle; and
    a plurality of corner leads connected to and extending from the sides of the frame body in close proximity to respective ones of the frame corners, each of the corner leads extending in spaced, generally parallel relation to at least one of the peripheral edge segments of the die paddle.

2. The leadframe of claim 1 wherein the frame body and the die paddle have complementary quadrangle shapes.

3. The leadframe of claim 1 wherein each of the corner leads extends in generally parallel relation to the second portion of each of the tie bars and perpendicularly toward a respective one of the leads.

4. The leadframe of claim 3 wherein:
    four tie bars are included in the leadframe, with the second portions of two of the tie bars each extending perpendicularly to a first side of the frame body and the second portions of two of the tie bars extending perpendicularly to a second side of the frame body which extends in spaced, generally parallel relation to the first side; and
    four corner leads are included in the leadframe, with two of the corner leads extending perpendicularly from the first side of the frame body and two of the corner leads extending perpendicularly from the second side of the frame body.

5. The leadframe of claim 1 wherein each of the corner leads extends perpendicularly toward the second portion of a respective one of the tie bars and in generally parallel relation to certain ones of the leads.

6. The leadframe of claim 5 wherein:
    four tie bars are included in the leadframe, with the second portions of two of the tie bars each extending perpendicularly to a first side of the frame body and the second portions of two of the tie bars each extending perpendicularly to a second side of the frame body disposed in spaced, generally parallel relation to the first side; and
    four corner leads are included in the leadframe, with two of the corner leads extending perpendicularly from a third side of the frame body in generally parallel relation to the first and second sides, and two of the corner leads extend perpendicularly from a fourth side of the frame body in generally parallel relation to the first and second sides, the third and fourth sides of the frame body extending in spaced, generally parallel relation to each other.

7. The leadframe of claim 1 wherein each of the tie bars further comprises a third portion which extends angularly from the first portion and generally perpendicularly relative to the second portion, the third portion of each of the tie bars extending perpendicularly into connection with one of the sides of the frame body.

8. The leadframe of claim 7 wherein each of the corner leads extends perpendicularly toward a respective one of the third portions of the tie bars.

9. The leadframe of claim 1 wherein each of the corner leads includes a generally planar first corner lead surface and a generally planar second corner lead surface disposed in opposed relation to the first corner lead surface.

10. The leadframe of claim 1 wherein each of the leads comprises:
a generally planar first lead surface;
a generally planar second lead surface disposed in opposed relation to the first lead surface; and
a generally planar lead etch surface disposed in opposed relation to the first lead surface and perpendicularly recessed relative to the second lead surface;
the lead etch surface being disposed adjacent to the die paddle.

11. The leadframe of claim 10 wherein each of the tie bars is of a thickness which is in the range of about thirty percent to about seventy percent of a thickness of each of the leads between the first lead surface and the second lead surface thereof.

12. The leadframe of claim 10 wherein portions of the first lead surface and the lead etch surface of each of the leads extend toward a respective one of the peripheral edge segments of the die paddle at a predetermined angle.

13. The leadframe of claim 1 wherein the die paddle comprises:
a generally planar first paddle surface;
a generally planar second paddle surface disposed in opposed relation to the first paddle surface; and
a generally planar paddle etch surface disposed in opposed relation to the first paddle surface and perpendicularly recessed relative to the second paddle surface, the paddle etch surface extending along the peripheral edge segments of the die paddle.

14. A semiconductor package comprising:
a die paddle including four peripheral edge segments, each adjacent pair of peripheral edge segments collectively defining a paddle corner;
a plurality of tie bars, each of the tie bars comprising a first portion extending from a respective paddle corner of the die paddle and a second portion which extends angularly from the first portion;
a plurality of leads extending toward and in spaced relation to respective ones of the peripheral edge segments of the die paddle;
a plurality of corner leads disposed adjacent respective ones of the second portions of the tie bars, each of the corner leads extending in spaced, generally parallel relation to at least one of the peripheral edge segments of the die paddle;
a semiconductor die attached to the die paddle and including a plurality of bond pads;
a plurality of conductive wires mechanically and electrically connecting the bond pads of the semiconductor die to respective ones of the leads and the corner leads; and
a package body formed on and at least partially encapsulating the die paddle, the tie bars, the leads, the corner leads, the semiconductor die, and the conductive wires.

15. The semiconductor package of claim 14 wherein the semiconductor die is attached to the die paddle via a layer of die attach material.

16. The semiconductor package of claim 14 wherein the corner leads each extend in generally parallel relation to the second portions of the tie bars.

17. The semiconductor package of claim 14 wherein the corner leads each extend in generally perpendicular relation to the second portion of a respective one of the tie bars.

18. The semiconductor package of claim 14 wherein each of the tie bars further comprises a third portion which extends angularly from the first portion and in generally perpendicular relation to the second portion.

19. The semiconductor package of claim 14 wherein:
each of the corner leads includes a generally planar first corner lead surface and a generally planar second corner lead surface disposed in opposed relation to the first corner lead surface; and
a portion of the first corner lead surface and the entirety of the second corner lead surface are exposed within the package body.

20. The leadframe of claim 14 wherein:
each of the leads comprises a generally planar first lead surface, a generally planar second lead surface disposed in opposed relation to the first lead surface, and a generally planar lead etch surface disposed in opposed relation to the first lead surface and perpendicularly recessed relative to the second lead surface, the lead etch surface being disposed adjacent to the die paddles; and
a portion of the first lead surface and the entirety of the second lead surface are exposed within the package body.

21. The semiconductor package of claim 14 wherein:
the die paddle comprises a generally planar first die paddle surface, a generally planar second die paddle surface disposed in an opposed relation to the first die paddle surface, and a generally planar paddle etch surface disposed in opposed relation to the first paddle surface and perpendicularly recessed relative to the second paddle surface, the paddle etch surface extending along the peripheral edge segments of the die paddle; and
the second paddle surface is exposed within the package body.

22. The leadframe of claim 20 wherein each of the tie bars is of a thickness which is in the range of about thirty percent to about seventy percent of a thickness of each of the leads between the first lead surface and the second lead surface thereof.

23. The leadframe of claim 20 wherein portions of the first lead surface and the lead etch surface of each of the leads extend toward a respective one of the peripheral edge segments of the die paddle at a predetermined angle.

24. A method of fabricating a semiconductor package, comprising the steps of:
a) providing a leadframe comprising:
a frame body including four peripheral sides, each adjacent pair of the sides collectively defining a frame corner, the frame body defining a central space;
a die paddle disposed within the space and including four peripheral edge segments, each adjacent pair of peripheral edge segments collectively defining a paddle corner;
a plurality of tie bars, each of the tie bars comprising a first portion extending from a respective paddle corner of the die paddle and a second portion which extends angularly from the first portion and perpendicularly into connection with one of the sides of the frame body;
a plurality of leads connected to and extending from the sides of the frame body toward and in spaced relation to respective ones of the peripheral edge segments of the die paddle; and a plurality of corner leads connected to and extending from the sides of the frame body in close proximity to respective ones of the frame corners, each of the corner leads extending in spaced, generally parallel relation to at least one of the peripheral edge segments of the die paddle;

b) attaching a semiconductor die having a plurality of bond pads to the die paddle;

c) mechanically and electrically connecting the bond pads of the semiconductor die to respective ones of the leads and the corner leads via conductive wires; and d) forming a package body on the leadframe in a manner at least partially encapsulating the semiconductor die, the conductive wires, the die paddle, the tie bars, the leads, and the corner leads.

25. The method of claim 24 further comprising the step of:

e) singulating the semiconductor package to cut the leads and the corner leads from the frame body of the leadframe.

* * * * *